United States Patent
Ikeda (10) Patent No.: US 9,741,542 B2
(45) Date of Patent: Aug. 22, 2017

(54) PLASMA GENERATION DEVICE

(71) Applicant: IMAGINEERING, INC., Kobe (JP)

(72) Inventor: Yuji Ikeda, Kobe (JP)

(73) Assignee: IMAGINEERING, INC., Kobe (JP)

( * ) Notice: Subject to any disclaimer, the term of this patent is extended or adjusted under 35 U.S.C. 154(b) by 10 days.

(21) Appl. No.: 14/725,454

(22) Filed: May 29, 2015

(65) Prior Publication Data
US 2015/0340206 A1 Nov. 26, 2015

Related U.S. Application Data

(63) Continuation of application No. PCT/JP2013/082155, filed on Nov. 29, 2013.

(30) Foreign Application Priority Data

Nov. 30, 2012 (JP) ................................. 2012-263706

(51) Int. Cl.
*H01J 37/32* (2006.01)
*H01J 37/244* (2006.01)
(Continued)

(52) U.S. Cl.
CPC .......... *H01J 37/32155* (2013.01); *F02P 3/02* (2013.01); *F02P 5/1502* (2013.01); *F02P 9/007* (2013.01);
(Continued)

(58) Field of Classification Search
CPC ........ H05H 1/46; H05H 1/4607; H05H 1/463; H05H 1/52; F02P 3/02; F02P 9/00;
(Continued)

(56) References Cited

U.S. PATENT DOCUMENTS 5,688,357 A * 11/1997 Hanawa ............ H01J 37/32266
156/345.28
2010/0300620 A1* 12/2010 Kanda ................... H01J 37/321
156/345.28
(Continued)

FOREIGN PATENT DOCUMENTS

JP 2005-204405 A 7/2005
JP 2011-169179 A 9/2011

OTHER PUBLICATIONS

International Search Report dated Feb. 25, 2014 issued in corresponding application No. PCT/JP2013/082155.

*Primary Examiner* — Jimmy Vu
*Assistant Examiner* — Henry Luong
(74) *Attorney, Agent, or Firm* — Bacon & Thomas, PLLC (57) ABSTRACT

A plasma generating device that improves plasma generating efficiency can further accommodate changes in plasma generating state because of changes in conditions of surroundings and the like. The plasma generating device is provided with an electromagnetic wave radiating device, which has an electromagnetic wave generating device that oscillates electromagnetic waves and a radiating antenna that radiates electromagnetic waves oscillated by the electromagnetic wave generating device, and a control device that controls the electromagnetic wave radiating device. The electromagnetic wave radiating device is provided with a power detector that detects traveling wave power output by the electromagnetic wave generating device and reflected wave power reflected from the radiating antenna, and the control device automatically controls the oscillation pattern for the electromagnetic waves on the basis of the proportion of the value for the reflected wave power to the value for the traveling wave power detected by the power detector.

8 Claims, 6 Drawing Sheets

(51) Int. Cl.
*H05H 1/46* (2006.01)
*F02P 3/02* (2006.01)
*F02P 5/15* (2006.01)
*F02P 9/00* (2006.01)
*F02P 23/04* (2006.01)
*H05H 1/52* (2006.01)
*F02P 15/10* (2006.01)

(52) U.S. Cl.
CPC .......... *F02P 23/045* (2013.01); *H01J 37/244* (2013.01); *H01J 37/3211* (2013.01); *H01J 37/32146* (2013.01); *H05H 1/46* (2013.01); *H05H 1/52* (2013.01); *F02P 15/10* (2013.01); *H05H 2001/463* (2013.01); *H05H 2001/4682* (2013.01); *Y02T 10/46* (2013.01)

(58) Field of Classification Search
CPC .. F02P 9/002; F02P 9/007; F02P 15/10; F02P 2017/121; H01J 37/32155; H01J 37/3211; H01J 37/3222; H01J 37/244; H01J 37/32146; H01J 37/32266; H01J 37/32275
USPC .............. 315/111.01, 111.21, 111.41, 111.71
See application file for complete search history.

(56) References Cited

U.S. PATENT DOCUMENTS

2011/0032047 A1* 2/2011 Yuzurihara ....... H01J 37/32082 332/108
2013/0026848 A1* 1/2013 Ito ........................ B60L 11/182 307/104

* cited by examiner

PLASMA GENERATION DEVICE

TECHNICAL FIELD

The present invention relates to a plasma generating device.

BACKGROUND ART

Plasma generating device using an electromagnetic wave is being developed. For example, JP 2007-113570A discloses a plasma generating device that generates plasma discharge in an internal combustion engine by emitting microwave before or after the ignition of an air-fuel mixture. This plasma generating device allows creating local plasma using a discharge of ignition plug and this plasma can be enlarged by the microwave.

However, the conventional plasma generating device does not have enough plasma generation and enlargement efficiency against the consuming electric power. Further, the maintenance of plasma generation/enlargement efficiency is difficult to be maintained in high condition because the plasma state fluctuates due to variation of surrounding conditions.

PRIOR ART DOCUMENTS

Patent Documents

Patent Document 1: JP 2007-113570A

THE DISCLOSURE OF THE INVENTION

Problems to be Solved by the Invention

The present invention has been made in view of the above described circumstances, and the objective is to improve the plasma generation and enlargement efficiency against the consuming electric power. Further, the objective is to provide plasma generating device that can maintain the plasma generation and enlargement efficiency in accordance with the fluctuation of plasma state due to variation of the environmental state.

Means for Solving the Problems

To solve the above mentioned problems, the plasma generating device of the present invention includes an electromagnetic wave generating device that oscillates electromagnetic waves and an emission antenna that emits the electromagnetic waves oscillated from the electromagnetic wave generating device, and a control device that controls the electromagnetic wave emission device. The electromagnetic wave emission device comprises an electric power detector that detects a progressive wave electric power outputted from the electromagnetic wave generating device and a reflective wave electric power reflected from the emission antenna. The control device automatically control the oscillation pattern of the electromagnetic waves based on the ratio of the reflective wave electric power value to the progressive wave electric power detected by the electric power detector The plasma generating device of the present invention can automatically control the oscillation pattern of electromagnetic waves so that the absorption of electromagnetic wave in plasma is promoted based on the ratio of the reflective wave electric power value to the progressive wave electric power value. Therefore, this plasma generating device can maintain the generation/enlargement efficiency of plasma in accordance with the change of the generated plasma condition.

The plasma generating device of the present invention further comprises a discharge device that generates discharge-plasma in a discharge gap. The discharge device is controlled by the control device. This plasma generating device can generate the initial plasma, which is a discharge-plasma, using the discharge device. This discharge-plasma can enlarge plasma efficiently by absorbing the electromagnetic waves in the discharge-plasma. Further, oscillation control of the electromagnetic wave is executed corresponding to the change of the plasma condition, and the enlargement efficiency of the plasma can be thus maintained in higher condition.

In the plasma generating device of the present invention, it is preferable that the control device outputs a command signal so that the basic oscillation pattern is used as an oscillation pattern of the electromagnetic waves when the ratio is less than or equal to the first threshold value. When this ratio is equal to or less than the first threshold value, a sufficient amount of electromagnetic waves shall be emitted from the emission. When this emitted electromagnetic wave is absorbed by plasma sufficiently, the plasma can be generated and enlarged efficiently by continuing the predetermined basic oscillation pattern.

The basic oscillation pattern preferably includes an intermittent electromagnetic wave pulse. The plasma generating device of the present invention can improve a generation/enlargement efficiency against the consuming electric power by use of basic oscillation pattern including an intermittent electromagnetic pulse. That is, according to this plasma generating device, the electromagnetic waves of predetermined pulse width are emitted for enlarging the plasma, and the plasma is suspended during the survival time of the generated radical. The repetition of this enlargement and suspension cycles allows an efficient enlargement of plasma. As a result, the power consumption is reduced and the erosion of the plug can be reduced.

The control device preferably outputs a suspension command signal so that an oscillation output is suspended for a predetermined time when the ratio is equal to or more than the second threshold value which is set larger than the first threshold value. When the ratio of the reflective wave electric power value to the progressive wave electric power value is equal to or more than the second threshold value, i.e. when the amount of electromagnetic waves emitted from the emission antenna is insufficient compared to progressive wave electric power and the ratio of the reflective wave electric power is high, the power is consumed excessively if the output is maintained with same conditions. The plasma generating device of the present invention suspends the oscillation output for a predetermined period in this kind of case can be adjusted and malfunctions can be resolved by adjusting the conditions of plasma formation region. The final power consumption is thereby reduced.

The control device preferably adjusts the oscillation pattern of electromagnetic waves so that the reflective wave electric power becomes small and that the ratio becomes equal to or smaller than the first threshold value when the ratio is larger than the first threshold value and smaller than the second threshold value in accordance with the above mentioned ratio. Although when the ratio of the reflective wave electric power value to the progressive wave electric power value is larger than the first threshold value and smaller than the second threshold value and the amount of reflecting reflective wave electric power that reflects at the emission antenna is large if the suspension of the oscillation output is not necessary and does not have to restudy the conditions of a plasma formation region, but a sufficient improvement can be seen by adjusting the oscillation pattern The adjustment of the oscillation pattern of the electromagnetic waves is executed preferably based on among an oscillating frequency, an electric power, an output timing, an output period, and a number of times of the output of the electromagnetic waves; a pulse width, a pulse position in a pulse cycle or a burst cycle of the electromagnetic wave pulse; and a standing wave phase of the electromagnetic waves. The reflective wave electric power from the emission antenna can be reduced efficiently by adjusting the frequency, electric power, and output timing of the oscillating electromagnetic waves according to the conditions such as radical amount, temperature, and pressure of the plasma formation region.

The plasma generating device can be used preferably for an internal combustion engine. The plasma generating device of the present invention can improve the generation/enlargement efficiencies of plasma by controlling the oscillation pattern of electromagnetic waves according to the plasma generation situation. Therefore, the internal combustion engines equipping this kind of plasma generating device improves the combustion efficiency of the fuel and can efficiently improve the gas mileage.

Advantage of the Invention

The plasma generating device of the present invention improves the generation/enlargement efficiency of the plasma against the consuming electric power and can further generate/enlarge the plasma efficiently in accordance with the fluctuation of the plasma generation condition due to change of environmental conditions. Therefore, the plasma generating device of the present invention can improve the gas mileage efficiently when this device is used for automobile engine.

DETAILED DESCRIPTION

In the following, a detailed description will be given by an embodiment of the present invention with reference to the accompanying drawings. It should be noted that the following embodiments are merely preferable examples, and do not limit the scope of the present invention, applied field thereof, or application thereof.

First Embodiment
Internal Combustion Engine

The present embodiment relates to an internal combustion engine comprising plasma generating device 1 of the present invention. Internal combustion engine 10 includes internal combustion engine body 11, discharge device 12, electromagnetic wave emission device 13, and control device 35. Discharge-plasma is generated using discharge device 12 in internal combustion engine 10, and the burning cycle that combusts the air-fuel mixture using the electromagnetic waves from electromagnetic wave emission device 13 is executed repetitively. Electric power detector 15 detects the progressive wave electric power that is oscillated from electromagnetic wave generating device 31 and the reflective wave electric power reflected from emission antenna 16 of electromagnetic waves which are oscillated from electromagnetic wave generating device 31, and transmits those values to control device 35. Control device 35 determines the oscillation pattern of the electromagnetic waves that is oscillated from electromagnetic wave generating device 31 in accordance with the rate of reflective wave electric power to the progressive wave.

Internal Combustion Engine Body

Figure 1:
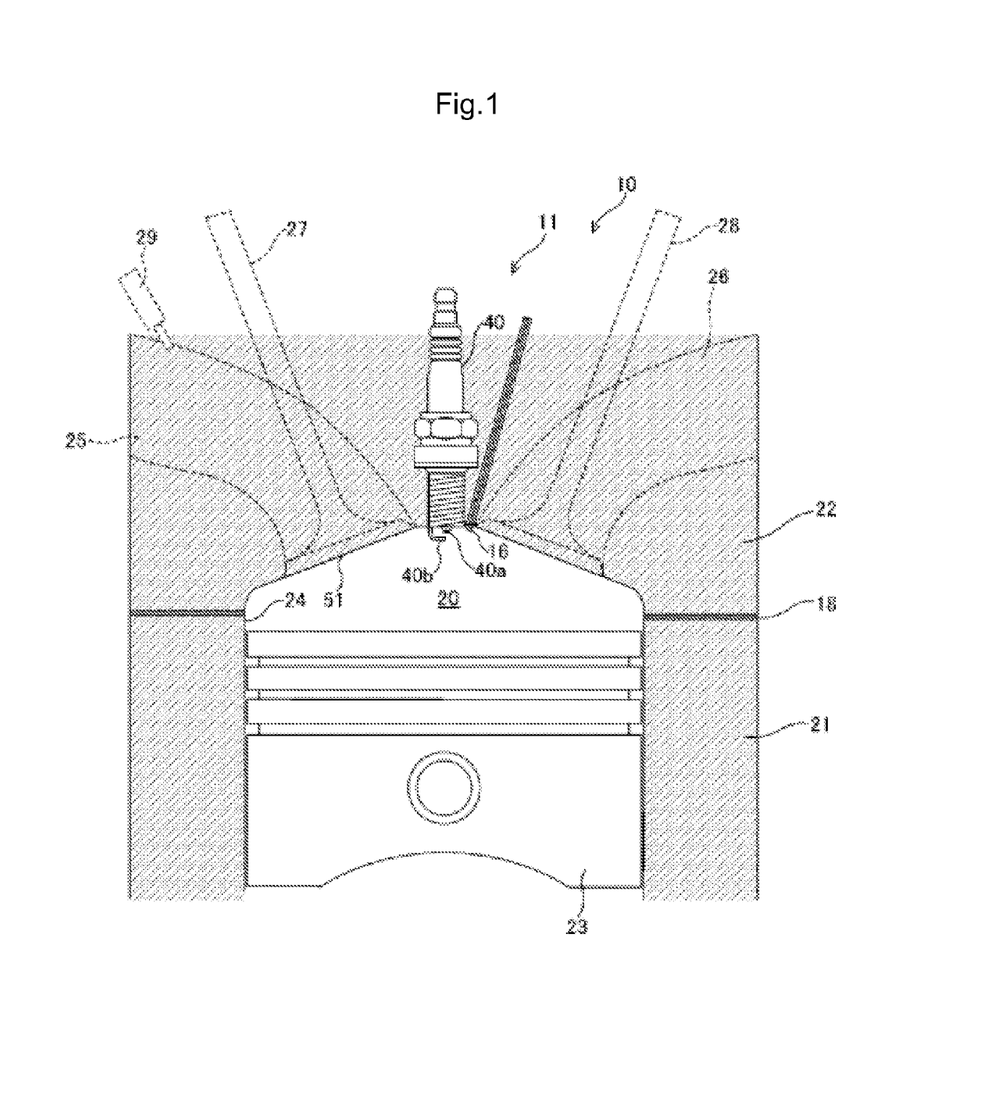
FIG. 1 is a sectional view of the internal combustion engine of an embodiment.

As shown in FIG. 1, internal combustion engine body 11 includes cylinder block 21, cylinder head 22 and piston 23. Multiple cylinders 24 having circular cross sections are formed in cylinder block 21. Piston 23 is formed in each cylinder 24 so as to reciprocate freely. Piston 23 is connected to a crankshaft via a connecting rod (not illustrated). The crankshaft is supported by cylinder block 21 so as to rotate freely. When piston 23 reciprocates in the axial direction of cylinder 24 in each cylinder 24, the connecting rod converts a reciprocation of piston 23 to a rotation of the crankshaft.

Cylinder head 22 is placed on cylinder block 21 so as to sandwich a gasket 18. Cylinder head 22 constitutes a compartment portion that defines combustion chamber 20 having a circular section together with cylinder 24, piston 23, and gasket 18. The diameter of combustion chamber 20 is, for example, approximately a half of the wavelength of the microwave emitted to combustion chamber 20 from electromagnetic wave emission device 13.

Spark plug 40, constituting ignition device 12, is formed for each cylinder 24 in cylinder head 22. Tip part of spark plug 40, exposing to combustion chamber 20, is located in the central part of ceiling side 51 (a surface of cylinder head 22 that faces combustion chamber 20) of combustion chamber 20 as shown in FIG. 1. Center electrode 40a and earth electrode 40b are formed in the tip part of spark plug 40. The discharge gap is formed between the tip of center electrode 40a and tip part of earth electrode 40b.

Inlet port 25 and exhaust port 26 are formed for each cylinder 24 in cylinder head 22. Air intake valve 27 that opens and closes air intake side opening 25a of inlet port 25, and injector 29 that injects fuel are arranged in inlet port 25. Exhaust valve 28 that opens and closes exhaust gas side opening 26a of exhaust port 26 is formed in exhaust port 26. In internal combustion engine 10, inlet port 25 is designed so that a strong tumble flow is formed inside combustion chamber 20.

Discharge Device

Figure 2:
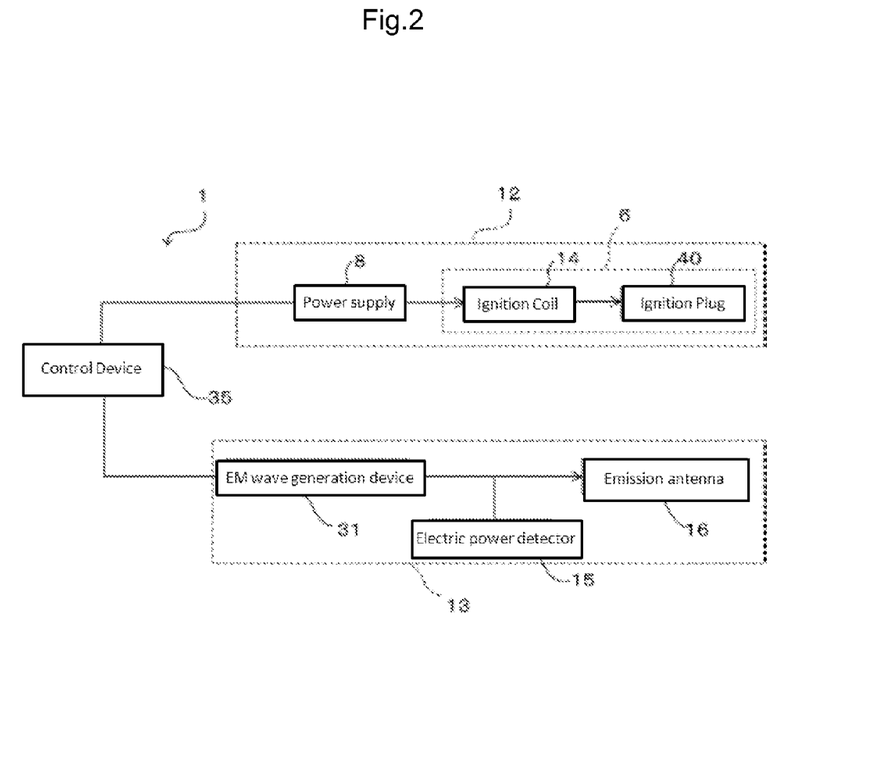
FIG. 2 is a block diagram of the plasma generating device of an embodiment.

Discharge device 12 is provided for every combustion chamber 20. As shown in FIG. 2, each discharge device 12 includes power source 8 and discharge electrode 6. This discharge electrode 6 includes ignition coil 14 that outputs high-voltage pulse, and spark plug 40 to where a high-voltage pulse outputted from ignition coil 14 is supplied.

Ignition coil 14 is connected to power supply 8. Ignition coil 14 amplifies the voltage applied from power supply 8 when an ignition signal is received from control device 35. Then the amplified high-voltage pulse is outputted to center electrode 40*a* of spark plug 40. When the high-voltage pulse is applied to center electrode 40*a*, a dielectric breakdown occurs in the discharge gap and a spark discharge arises in spark plug 40. Discharge-plasma is generated in a discharge pass of the spark discharge.

Electromagnetic Wave Emission Device

As shown in FIG. 2, electromagnetic wave emission device 13 includes electromagnetic wave generation device 31, power detector 15, and emission antenna 16.

Electromagnetic wave generation device 31 outputs microwave pulses repetitively with a predetermined duty ratio when an electromagnetic wave drive signal is received from control device 35. Electromagnetic wave drive signal is a pulse signal. Electromagnetic wave generation device 31 outputs microwave pulses repetitively during the pulse width period of the electromagnetic wave drive signal. A semiconductor oscillator generates microwave pulses in electromagnetic wave generation device 31. Other types of oscillators, such as magnetron can be used instead of a semiconductor oscillator.

Emission antennas 16 are formed in respective combustion chamber 20. Emission antenna 16 is formed near spark plug 40 on ceiling surface of combustion chamber 20. Each emission antenna 16 is insulated electrically from cylinder head 22.

Electric power detector 15 detects a progressive wave electric power oscillated from electromagnetic wave generating device 31 and a reflective wave electric power reflected from emission antenna 16. These values are transmitted to control device 35. In control device 35, the ratio of reflective wave electric power to the progressive wave electric power is calculated, and an oscillation pattern oscillated from electromagnetic wave generating device 31 is determined corresponding to this value. Control device 35 is configured so as to control a drive sequence and to execute an automatic control of the determined electromagnetic wave oscillation pattern in real-time for example.

Operation of the Control Device

Operation of control device 35 will be discussed.

Control device 35 determines an ignition timing of each combustion chamber 20 from a control map based on an operating condition of internal combustion engine 20, and controls each ignition device 12 provided for each combustion chamber 20 and electromagnetic wave emission device 13 formed one by one for multiple combustion chambers 20.

Control device 35 outputs an ignition signal to ignition device 12. When ignition device 12 receives an ignition signal, the spark discharge occurs in the discharge gap of spark plug 40 as discussed above.

Control device 35 outputs an electromagnetic wave drive signal to electromagnetic wave emission device 13 at a timing corresponding to the output timing of the ignition signal (for example, immediately after an outputting timing of the ignition signal). When a predetermined patterned electromagnetic wave drive signal is received, electromagnetic wave generation device 31 outputs the microwave pulses repetitively during the electromagnetic wave emission period. Control device 35 outputs the predetermined patterned electromagnetic wave during the electromagnetic wave emission period.

Electric power detector 15 transmits the values of progressive wave electric power Pf oscillated from electromagnetic wave generating device 31 and reflective wave electric power Pr reflected from emission antenna 16 to control device 35. Control device 35 calculates the ratio (Pr/Pf) of reflective wave electric power Pr to progressive wave electric power Pf based on these values transmitted from electric power detector 15.

In this embodiment, control device 35 selects an adequate oscillation pattern among the predetermined oscillation pattern that are programmed beforehand according to ratio Pr/Pf, where Pf and Pr are the calculated progressive wave electric power and the reflective wave electric power respectively. Multiple oscillation patterns are programmed beforehand in control device 35 in control device 35, that are selected based on ratio (Pr/Pf) of reflective wave electric power Pr to progressive wave electric power Pf based on a discharge-plasma state in ignition plug 40 and a combustion state in combustion chamber 20.

Figure 3:
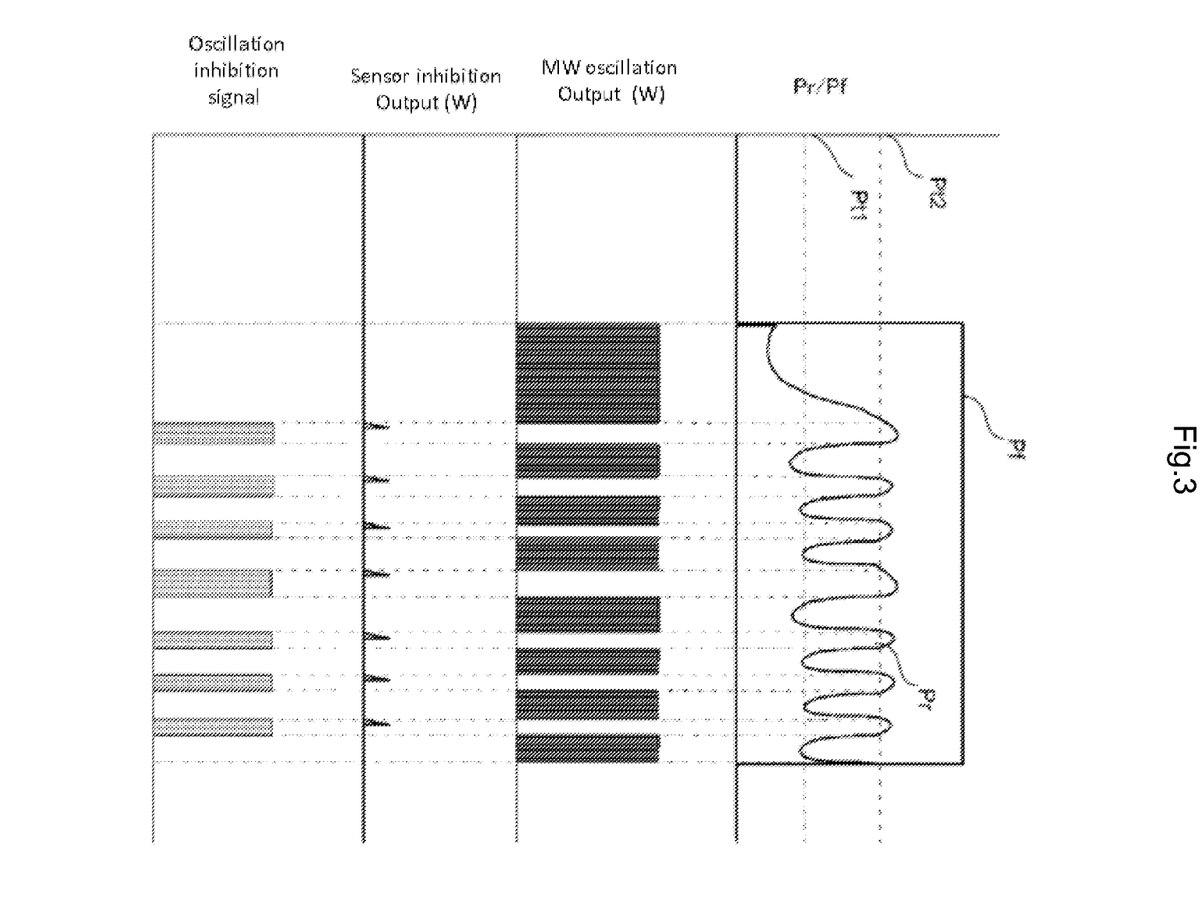
FIG. 3 is a view indicating an example of a time variation of the reflective wave electric power in the plasma generating device of an embodiment.

The value of reflective wave electric power Pr reflected from emission antenna 16 changes according to the states of combustion chamber 20. For example, when a discharge-plasma generates due to a spark discharge at spark plug 40 in discharge device 12, the electromagnetic wave emitted from emission antenna 16 is absorbed efficiently by this discharge-plasma. The reflective wave electric power Pr thus becomes low value. Therefore, when combustion chamber 20 is in a state that tends to absorb electromagnetic waves, the reflective wave electric power Pr becomes low value.

Figure 5:
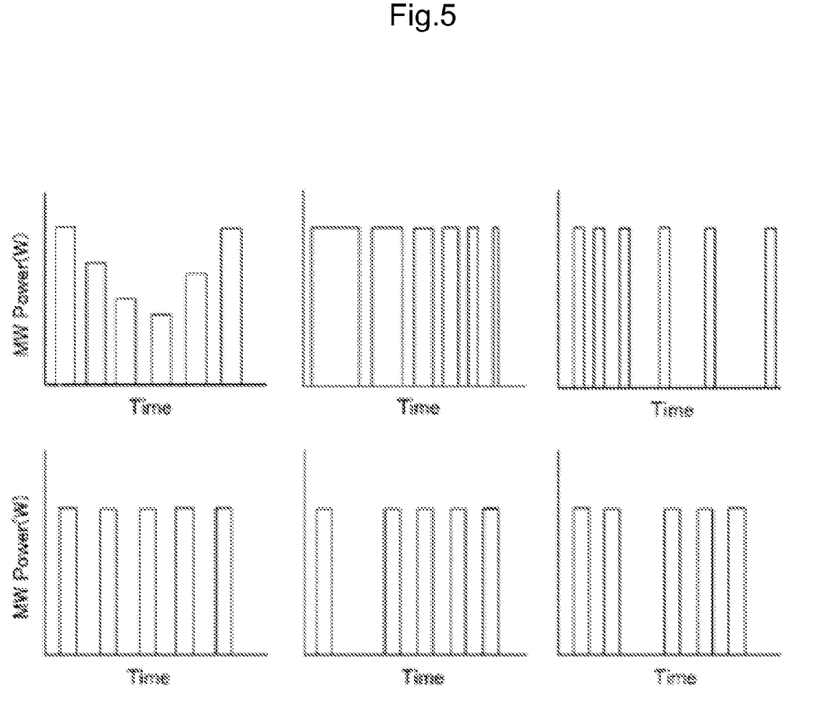
FIG. 5 is a view indicating other example 15 of oscillation pattern of the electromagnetic waves in the plasma generating device of an embodiment.
Figure 6:
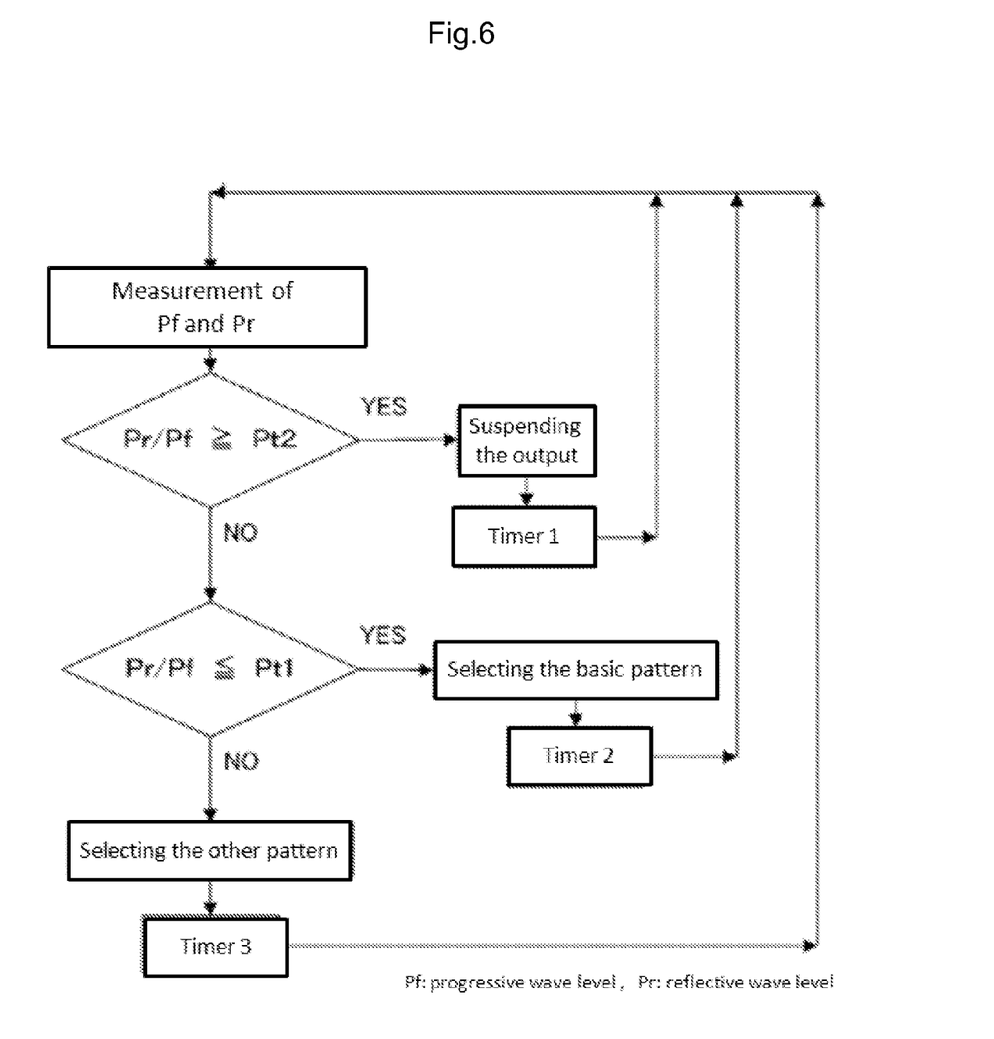
FIG. 6 is a flow chart indicating a process of oscillation control of the electromagnetic waves in the plasma generating device of an embodiment.

Flow chart of FIG. 6 indicates an oscillation control process of electromagnetic wave in the plasma generating device of the present embodiment. Control device 35 determines whether the ratio (Pr/Pf) of reflective wave electric power Pr to progressive wave electric power Pf is equal to or larger than second threshold value Pt2 which is set larger than first threshold value Pt1. When Pr/Pf is equal to or larger than Pt2 (when YES), an oscillation suspension signal is emitted and suspends an oscillation output for a predetermined period. When Pr/Pf is smaller than Pt2 (when NO), whether Pr/Pf is equal to or smaller than first threshold value Pt1 is then determined. When Pr/Pf is equal to or less than Pt1 (when YES), a basic oscillation pattern is selected among multiple oscillation patterns. When Pr/Pf is larger than Pt1 (when NO), i.e., when Pr/Pf is larger than Pt1 and smaller than Pt2, the other oscillation pattern which is modified from the basic oscillation pattern is selected. This other oscillation patterns are, for example, those indicated in FIG. 5. The adequate oscillation pattern is selected according to the value Pr/Pf, within a range between Pt1 and Pt2.

Figure 4:
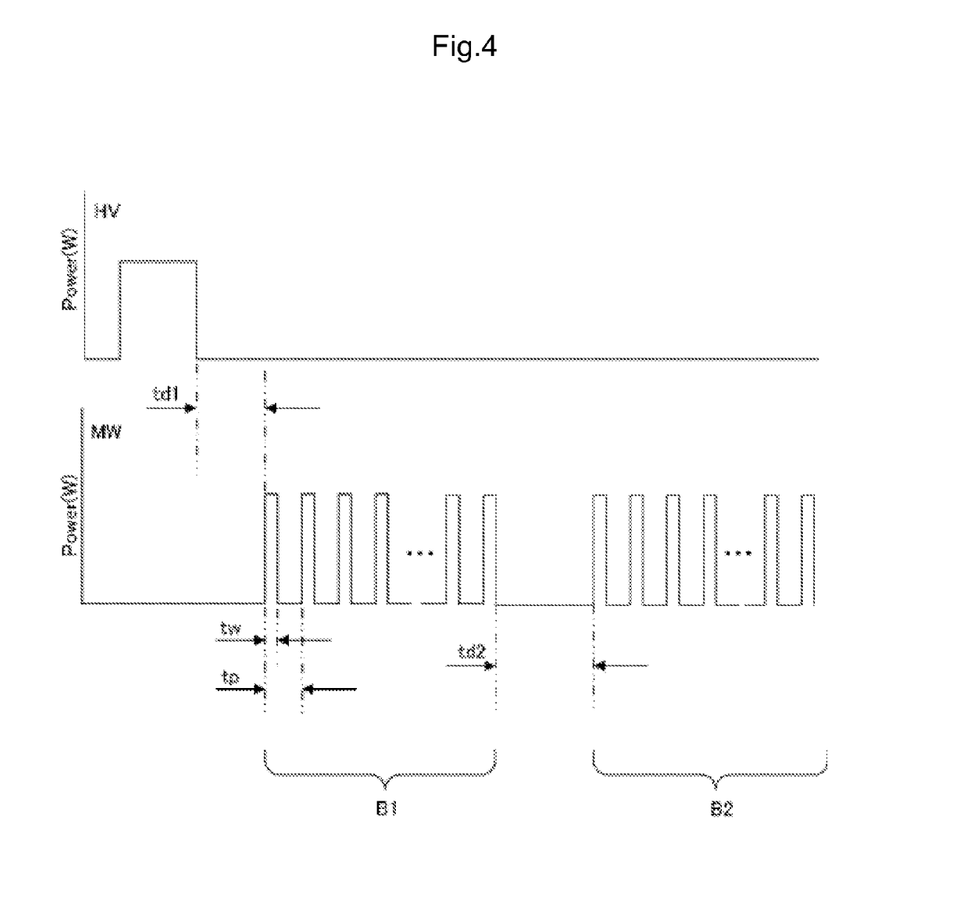
FIG. 4 is view indicating an example of basic oscillation pattern of the electromagnetic waves in the plasma generating device of an embodiment.

The basic oscillation pattern, which is selected when Pr/Pf is equal to or less than first threshold value Pt1, is a burst pattern (B1, B2) having a predetermined pulse width tw and pulse cycle tp that is repeated for a predetermined period, for example. Between each burst, delay time td is set. According to the internal combustion engine of the present embodiment, the discharge plasma generated at spark plug 40 can be enlarged and maintained using electromagnetic wave emitted conforming to this basic oscillation pattern and the combustion of air-fuel mixture is thereby promoted.

First threshold value Pt1 can be set to an adequate value in arbitrary timing according to the objective, combustion chamber environment, and outside environment. However, the value is set such that reflective wave electric power Pr is small and majority of oscillated electromagnetic wave is absorbed inside the combustion chamber, i.e., such that reflective wave electric power Pr against progressive wave electric power Pf becomes small. The first threshold value is usually equal to or less than 0.5, but equal to or less than 0.4 is preferable. Further, equal to or less than 0.3, 0.2, or 0.1 are much preferable.

Second threshold value Pt2 can be set to an adequate value in arbitrary timing according to the objective, combustion chamber environment, and outside environment. However, when the ratio exceeds the second threshold value Pt2, reflective wave electric power Pr is large and majority of oscillated electromagnetic wave becomes the reflective wave and mere adjustment of oscillating electromagnetic wave conditions is useless. In this case, the output of electromagnetic wave is suspended for physical adjustment such as repair of an instrument or allocation of emission antenna. Thus, second threshold value Pt2 is usually equal to or more than 0.6, but equal to or more than 0.7 is preferable. Further, equal to or less than 0.8, or 0.9 are much preferable.

The above mentioned other oscillation pattern, which is selected when Pr/Pf is larger than first threshold Pt1 and smaller than Pt2, shall not be limited as long as the pattern is selected such that the ratio Pr/Pf is equal to or smaller than first threshold value Pt1 and reflective wave electric power Pr is small. However, the pattern can be selected by changing at least one of the parameters of the basic oscillation patterns such as oscillating frequency, electric power, output timing, output period, and numbers of output of the electromagnetic wave; pulse width, and pulse position in the pulse cycle and burst cycle of electromagnetic wave pulse; and phase of electromagnetic wave. For example, a pattern where the duty (tw/tp) is changed, e.g. made larger, from the basic oscillation pattern, a pattern where a burst time (the length of B1 and B2 as shown in FIG. 4) or a burst cycle (the length B1+td2, as shown in FIG. 4) is changed, the numbers of oscillations in a burst cycle, a continuous wave pattern (which is not a pulse pattern. In this case, electromagnetic wave output shall be changed), irregular pulse pattern, or combination of these patterns. The examples of the above mentioned other oscillation patterns are shown in FIG. 5. The phase of electromagnetic wave shall be adjusted such that the phase changes from 0 to 90 degrees dynamically and the ratio Pr/Pf becomes the minimum so that an anti-node of the electromagnetic wave is located at the target plasma.

When the ratio Pr/Pf is equal to or larger than second threshold value Pt2, the suspension signal, which suspends an oscillation output for a predetermined period of time, can be connected to bias voltage of an oscillation output transistor.

Advantage of First Embodiment

The plasma generation device of the present embodiment controls so that an adequate oscillation pattern of electromagnetic wave is used according to the size of reflective wave electric power from the emission antenna. Thus, the plasma generation/enlargement efficiency against the electric power consumption is improved. The plasma can further be generated/enlarged efficiently so as to precisely follow the fluctuation of plasma condition (variation of surrounding condition). Therefore, plasma generating device 1 of the present embodiment can efficiently improve fuel consumption when this is used for automobile engine.

Modification 1 of the Embodiment

In the modification 1 of this embodiment, control device 35 sets third threshold value Pt3 between first threshold value Pt1 and second threshold value Pt2. When the ratio (Pr/Pf) of reflective wave electric power Pr to progressive wave electric power Pf is larger than first threshold value Pt1 and equal to or smaller than third threshold value Pt3 and is larger than third threshold value Pt3 and smaller than second threshold value Pt2, the adequate oscillation pattern is selected for each cases so that the reflective wave electric power Pr becomes much smaller and the ratio (Pr/Pf) becomes equal to or less than first threshold value Pt1. The plasma generating device 1 of the present invention thus allows changing the oscillation pattern of electromagnetic wave according to the ratio of the reflective wave electric power to the progressive wave electric power, i.e., combustion state in the combustion chamber, and the intensity of discharge plasma. Therefore, the plasma generating device 1 of this embodiment can further improve the generation and enlargement efficiency of the plasma against the consuming electric power. The setting of the threshold value can be added further.

Modification 2 of the Embodiment

In the modification 2 of this embodiment, the emission antenna of electromagnetic waves is provided inside spark plug 40. Spark plug 40 of this embodiment equips the main metal fittings made of conducting material and a cylindrical insulator that penetrates the main metal fittings similarly to a general spark plug. The insulator accommodates a stick-like center conductor and one edge exposes from the insulator and becomes an interface portion with the mixing circuit of the direct electric current and the electromagnetic wave. The other edge is exposed from the insulator and serves both as negative electrode of the electric discharge electrode and the antenna of the electromagnetic wave emission antenna. Such structure of this embodiment allows an attachment of plasma generating device 1 of the present invention without changing the structure of the combustion chamber of an automobile engine similarly to a commercial spark plug, and affords a reduction effect of gas mileage conveniently.

Modification 3 of the Embodiment

In the modification 3 of this embodiment, plasma generating device 1 does not include discharge device 12. The plasma generating device 1 of this embodiment can generate plasma in a combustion chamber by an electromagnetic wave emitted from electromagnetic wave emission device 13. Plasma can be expanded and maintained by emitting electromagnetic waves to the plasma which is generated with this structure.

Second Embodiment

Exhaust Gas Decomposition Device

The plasma generating device of the present invention can be used as an exhaust gas decomposition device. The device equips an electromagnetic wave generating device and a microwave resonant chamber (cavity) that resonates at a predetermined electromagnetic wave band, an emission antenna that emits electromagnetic waves inside a cavity, and a discharge electrode that discharges partially the gas inside the cavity. The emission antenna forms an intense electromagnetic wave in a plasma generating area originated by the discharge electrode. The plasma generation device of the present invention is controlled so that an adequate oscillation pattern of electromagnetic wave is selected conforming to the size of the reflective wave electric power from the emission antenna of electromagnetic wave. This improves a plasma generation and enlargement efficiency against the consuming electric power. The plasma can be further generated and enlarged efficiently by adjusting precisely to the variation of plasma state such as surrounding conditions. Therefore, the exhaust gas decomposition device equipping this plasma generation device can decompose an exhaust gas more efficiently.

To chemically oxidize, react and detoxicate a hazardous waste, a chemical substance, a suspended particulate matter or soot using a reaction product such as OH radical or ozone ($O_3$), non-equilibrium plasma of high pressure environment (atmospheric pressure, or 0.2 MPa or more) is generated in fluid 22 inside the microwave resonant chamber (cavity).

The greatest advantage of an atmospheric pressure/non-equilibrium plasma is to avoid heat or chemistry equilibrium restrictions and to control the reaction speed or conversion ratio of materials independent from temperature and pressure. The design flexibility of the reactor for reacting with the generated plasma can be made high, and a light weight, compact and good response reactor can be structured. The atmospheric pressure/non-equilibrium plasma can be used for, for example, direct composition of methanol from methane, natural gas steam reforming, acetylene composition or liquefaction of natural gas.

The unburned gas in combustion/reaction chamber, the soot, or the exhaust gases such as NOx disconnects the carbon-carbon bonding or carbon-hydrogen bonding by strong oxidization ability of ozone or OH radical accompanied by a plasma generation, and detoxificate the exhaust gas ingredient to a harmless and stable oxide or carbon by oxidization or chemical reaction of OH. Generated amount of OH radical and O3, or luminescence intensity are measured in the measurement part allocated in the lower stream side using OH sensor or O3 sensor in real-time. This measurement result is then calculated, and the emission antenna or discharge electrode is controlled to an arbitrary value so that the throughput of the flowing toxic substance can be controlled.

Third Embodiment
Ozone Generation/Sterilization/Disinfection/Deodorization Device When the present invention is applied to jet engines for airplanes, the present device can converted a high pressure steam containing moisture to a large amount of OH radical and O3 using non-equilibrium plasma generated by the present device. The exhaust gas under the flight has been polluted the air; however, the exhaust gas can be converted to a harmless gas using an intense oxidization ability of high volume OH radical and O3 and can generate a large amount of O3 for recovering the ozone layer in the stratosphere that was destroyed by chlorofluocarbon. The plasma generation device of the present invention increases the generation/enlargement efficiency of the plasma against the consuming electric power, and can further generate/enlarges plasma efficiently to in accordance with the plasma state change due to variation of surrounding conditions. Therefore, those devices comprising the present plasma generation device can perform ozone evolution, sterilization, disinfection, and deodorization more efficiently.

INDUSTRIAL APPLICABILITY

As discussed above, the present invention is appropriate for a plasma generation device for internal combustion engines such as an automobile engine, or exhaust gas treatment device.

EXPLANATION OF REFERENCE NUMERALS

1 Plasma generating device
6 Discharge electrode
8 Power supply
12 Discharge device
13 Electromagnetic wave emission device
14 Ignition coil
15 Electric power detector
16 Emission antenna
31 Electromagnetic wave generating device
35 Control device
40 Spark plug

The invention claimed is:

1. A plasma generating device including an electromagnetic wave generating device that oscillates electromagnetic waves and an emission antenna that emits the electromagnetic waves oscillated from the electromagnetic wave generating device, an electromagnetic wave emission device having the emission antenna, and a control device that controls the electromagnetic wave emission device, wherein
the electromagnetic wave emission device comprises an electric power detector that detects a progressive wave electric power outputted from the electromagnetic wave generating device and a reflective wave electric power reflected from the emission antenna, and
the control device determines, in view of a ratio of the reflective wave electric power to the progressive wave electric power, whether a plasma exists, and controls an oscillation pattern of the electromagnetic waves such that when the plasma exists the oscillation pattern of the electromagnetic waves is set according to the ratio, and when no plasma exists output of the electromagnetic waves is suspended for a predetermined time.

2. The plasma generating device as claimed in claim 1, further comprises a discharge device that generates a discharge-plasma in a discharge gap, wherein the discharge device is controlled by the control device.

3. The plasma generating device as claimed in claims 1, wherein when the ratio is less than or equal to a first threshold value, the control device outputs a command signal so that the oscillation pattern of the electromagnetic waves is set to a basic oscillation pattern.

4. The plasma generating device as claimed in claim 3, wherein the basic oscillation pattern includes an intermittent electromagnetic wave pulse.

5. The plasma generating device as claimed in claim 3, wherein the control device determines that the plasma does not exist when the ratio is equal to or more than a second threshold value that is set larger than the first threshold value.

6. The plasma generating device as claimed in claim 5, wherein the control device adjusts the oscillation pattern of electromagnetic waves so that the reflective wave electric power becomes small and that the ratio becomes equal to or smaller than the first threshold value when the ratio is larger than the first threshold value and smaller than the second threshold value in accordance with the ratio.

7. The plasma generating device as claimed in claim 6, wherein the adjustment of the oscillation pattern of the electromagnetic waves is executed based on among an oscillating frequency, an electric power, an output timing, an output period, and a number of times of the output of the electromagnetic waves; a pulse width, a pulse position in a pulse cycle or a burst cycle of the electromagnetic wave pulse; and a standing wave phase of the electromagnetic waves.

8. A plasma generating device as claimed in claim 1 wherein the device is used for an internal combustion engine.

* * * * *